(12) United States Patent
Arvin et al.

(10) Patent No.: US 11,004,614 B2
(45) Date of Patent: May 11, 2021

(54) STACKED CAPACITORS FOR USE IN INTEGRATED CIRCUIT MODULES AND THE LIKE

(71) Applicant: International Business Machines Corporation, Armonk, NY (US)

(72) Inventors: Charles L. Arvin, Poughkeepsie, NY (US); Sylvain Pharand, Quebec (CA); Bhupender Singh, Fishkill, NY (US); Brian W. Quinlan, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/211,345

(22) Filed: Dec. 6, 2018

(65) Prior Publication Data

US 2020/0185156 A1 Jun. 11, 2020

(51) Int. Cl.
| | | |
|---|---|---|
| *H01G 4/38* | (2006.01) | |
| *H01G 4/228* | (2006.01) | |
| *H01L 23/66* | (2006.01) | |
| *H01G 4/248* | (2006.01) | |
| *H01G 4/30* | (2006.01) | |
| *H01G 4/35* | (2006.01) | |

(52) U.S. Cl.
CPC .............. *H01G 4/38* (2013.01); *H01G 4/228* (2013.01); *H01L 23/66* (2013.01); *H01G 4/248* (2013.01); *H01G 4/30* (2013.01); *H01G 4/35* (2013.01); *H01L 2223/6666* (2013.01)

(58) Field of Classification Search
CPC ............ H01G 4/38; H01G 4/228; H01G 4/35; H01G 4/30; H01G 4/248; H01L 23/66; H01L 2223/6666
See application file for complete search history.

(56) References Cited

U.S. PATENT DOCUMENTS

| | | |
|---|---|---|
| 5,745,335 A | 4/1998 | Watt |
| 6,407,929 B1 | 6/2002 | Hale et al. |
| 6,819,543 B2 | 11/2004 | Vieweg et al. |
| 7,968,375 B1 | 6/2011 | Rahman et al. |
| 8,866,275 B2 * | 10/2014 | Camacho .......... H01L 23/49811 257/673 |
| 9,190,297 B2 | 11/2015 | Choi et al. |
| 9,337,138 B1 * | 5/2016 | Abugharbieh ...... H01L 23/5223 |
| 9,658,636 B2 | 5/2017 | Gupta et al. |

(Continued)

FOREIGN PATENT DOCUMENTS

JP 4280179 B2 6/2009

*Primary Examiner* — Rockshana D Chowdhury
(74) *Attorney, Agent, or Firm* — L. Jeffrey Kelly; Otterstedt, Wallace & Kammer, LLP

(57) ABSTRACT

A device including a substrate, an upper capacitor, and a lower capacitor is described. The upper capacitor is mounted on the substrate and includes an upper body and a pillar that extends from the upper body towards the substrate. The lower capacitor includes a lower body that is disposed both lateral to the pillar and at least in part between the upper body and the substrate. Each of the upper capacitor and the lower capacitor is a respective discrete circuit component. Such capacitor stacking configurations facilitate the placement of larger numbers of capacitors in close proximity to microprocessor cores in integrated circuit modules without the need to increase module size.

24 Claims, 7 Drawing Sheets

(56) References Cited

U.S. PATENT DOCUMENTS

| | | | |
|---|---|---|---|
| 9,922,955 B2* | 3/2018 | Camacho | H01L 23/49816 |
| 10,366,836 B2* | 7/2019 | Bultitude | B23K 1/008 |
| 2004/0125540 A1 | 7/2004 | Vieweg et al. | |
| 2013/0037936 A1 | 2/2013 | Choi et al. | |
| 2015/0381121 A1* | 12/2015 | Jones | H01L 23/047 |
| | | | 330/250 |
| 2016/0161970 A1 | 6/2016 | Gupta et al. | |
| 2016/0183384 A1* | 6/2016 | Trinh | H05K 3/3426 |
| | | | 228/123.1 |
| 2016/0192525 A1* | 6/2016 | Hu | H01L 25/0657 |
| | | | 361/736 |
| 2017/0162334 A1* | 6/2017 | Ra | H05K 1/111 |
| 2018/0144864 A1* | 5/2018 | Park | H01G 4/224 |

* cited by examiner

US 11,004,614 B2

STACKED CAPACITORS FOR USE IN INTEGRATED CIRCUIT MODULES AND THE LIKE

BACKGROUND

The present invention relates to the electrical, electronic, and computer arts, and, more particularly, to stacked capacitors for use in integrated circuit modules and the like.

Capacitors are frequently paired with microprocessor cores in integrated circuit (IC) modules (i.e., IC packages) to provide decoupling and diminish the effects of high frequency noise. It is not uncommon, for example, to find modules with microprocessor cores that are virtually surrounded by arrays of discrete capacitors. It is advantageous to place capacitors as close to a microprocessor core as possible. Close placement reduces the amount of line inductance and series resistance between the capacitors and the core Two types of surface-mount capacitors often used in modern IC modules are ceramic capacitors, frequently in the form of ceramic capacitor arrays, and silicon deep trench (Si DT) capacitors.

Ceramic capacitor arrays utilize parallel metal plates embedded in a dielectric ceramic material. FIG. 1 shows a perspective view of a conventional ceramic capacitor array 100, while FIG. 2 shows a side view of the ceramic capacitor array 100 attached to a substrate 105 of a module. The ceramic capacitor array 100 includes a ceramic body 110 housing the parallel metal plates, in combination with eight terminals 115 (sometimes called terminations). Attachment of the ceramic capacitor array 100 to the substrate 105 is via solder joints 120 (i.e., solder fillets) that act to connect the terminals 115 to bonding pads 125 on the substrate's surface.

Si DT capacitors utilize silicon substrates that house an array of deep trench capacitors patterned into the body of the capacitor. FIG. 3 shows a bottom perspective view of a conventional Si DT capacitor 300, while FIG. 4 shows a side view of the Si DT capacitor 300 attached to a substrate 305 of a module. The Si DT capacitor 300 relies on a flip chip technology (i.e., controlled collapse chip connection or C4) for its interconnection with the substrate 305. More specifically, the Si DT capacitor includes solder bumps 310 attached to an array of chip pads 315 on a body 320 of the Si DT capacitor 300. The solder bumps 310, in turn, are attached to an array of corresponding bonding pads 325 on the substrate 305.

Nevertheless, while ceramic capacitor arrays and Si DT capacitors are in widespread usage in modern IC modules, three limitations tend to restrict the extent to which these discrete circuit components can effectively be implemented in an IC module: 1) the limited areal capacitance of these capacitors, particularly Si DT capacitors; 2) limited module size; and 3) limitations on how close a given capacitor can be placed to a processor die due to the wiring emanating from that die (i.e., wire escape limitations). There is, as a result, a need for new approaches for implementing capacitors in IC modules that can address these limitations.

SUMMARY

Embodiments of the invention describe novel capacitor stacking configurations for use in IC modules that facilitate the placement of larger numbers of capacitors in close proximity to microprocessor cores without the need to increase module size.

Aspects of the invention are directed to an apparatus comprising a substrate, an upper capacitor, and a lower capacitor. The upper capacitor is mounted on the substrate and comprises an upper body and a pillar that extends from the upper body towards the substrate. The lower capacitor comprises a lower body that is disposed both lateral to the pillar and at least in part between the upper body and the substrate. Each of the upper capacitor and the lower capacitor is a respective discrete circuit component.

Additional aspects of the invention are directed to an apparatus comprising a substrate, an upper capacitor, a lower capacitor, and a middle capacitor. The upper capacitor is mounted on the substrate and comprises an upper body and a pillar that extends from the upper body towards the substrate. The lower capacitor comprises a lower body that is disposed both lateral to the pillar and at least in part between the upper body and the substrate. The middle capacitor comprises a middle body that is disposed both lateral to the pillar and at least in part between the upper body and the lower body. Each of the upper capacitor, the lower capacitor, and the middle capacitor is a respective discrete circuit component.

Even additional aspects of the invention are directed to a method wherein a substrate is received. An upper capacitor is mounted on the substrate, the upper capacitor comprising an upper body and a pillar that extends from the upper body towards the substrate. A lower capacitor comprising a lower body is placed such that the lower body is disposed both lateral to the pillar and at least in part between the upper body and the substrate. Each of the upper capacitor and the lower capacitor is a respective discrete circuit component.

Other aspects of the invention are directed to an apparatus comprising a substrate, a lower capacitor, and an upper capacitor. The lower capacitor is mounted on the substrate. The upper capacitor is mounted on the lower capacitor. Each of the lower capacitor and the upper capacitor is a respective discrete circuit component.

Finally, even other aspects of the invention are directed to a method wherein a substrate is received. A lower capacitor is mounted on the substrate. An upper capacitor is mounted on the lower capacitor. Each of the lower capacitor and the upper capacitor is a respective discrete circuit component.

BRIEF DESCRIPTION OF THE DRAWINGS

These and other features, aspects, and advantages of the present invention will become better understood with regard to the following description, appended claims, and accompanying drawings where:

DETAILED DESCRIPTION

The present invention will be described with reference to illustrative embodiments. For this reason, numerous modifications can be made to these embodiments and the results will still come within the scope of the invention. No limitations with respect to the specific embodiments described herein are intended or should be inferred.

As used herein and in the appended claims, a "discrete circuit component" means a component that offers one particular electrical property (e.g., capacitance) in lumped form (i.e., concentrated at one place in a circuit, rather than being distributed) and is constructed as a single, self-contained unit.

Each of the illustrative embodiments presented herein describe two or more capacitors configured for use in providing decoupling and noise filtering functions in an IC module. In each embodiment, the two or more capacitors are placed in a stacked configuration with one capacitor being above the other relative to the substrate. In this manner, more capacitors can be implemented over a given area of the module.

Figure 5A:
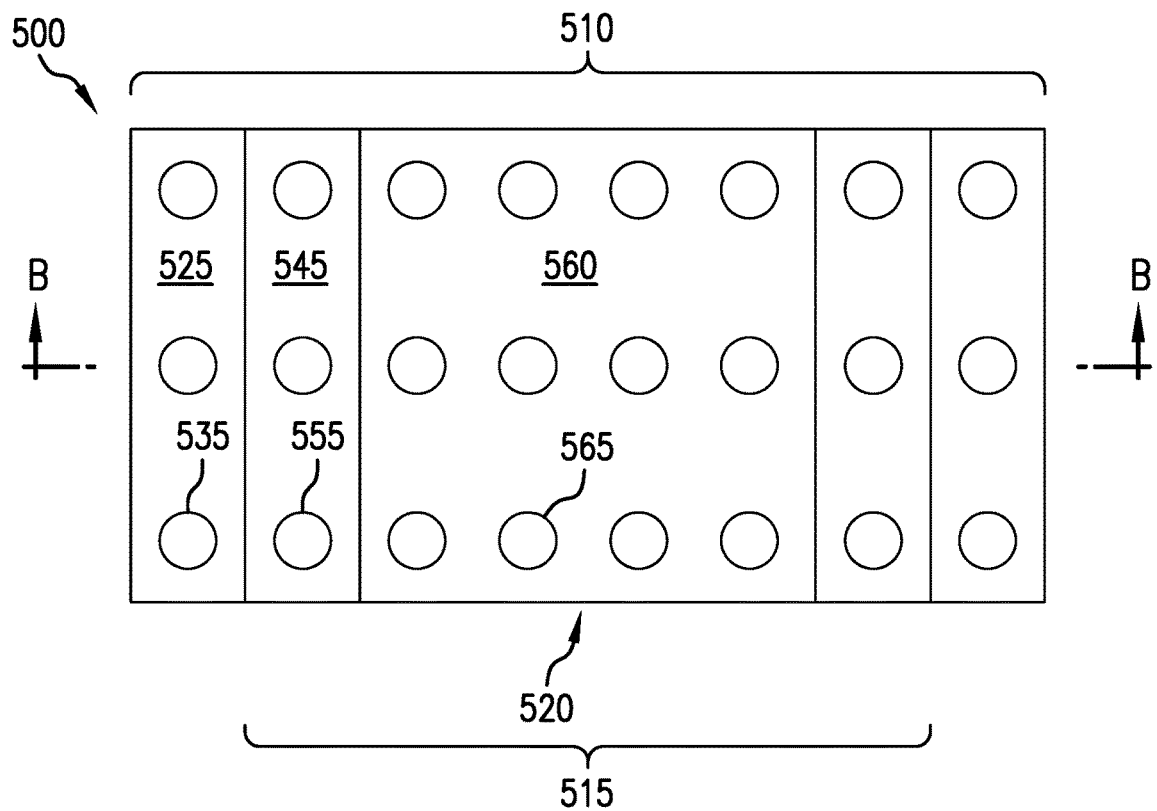
FIG. 5A shows a bottom view of three stacked capacitors configured for mounting to a substrate, in accordance with a first illustrative embodiment of the invention.
Figure 5B:
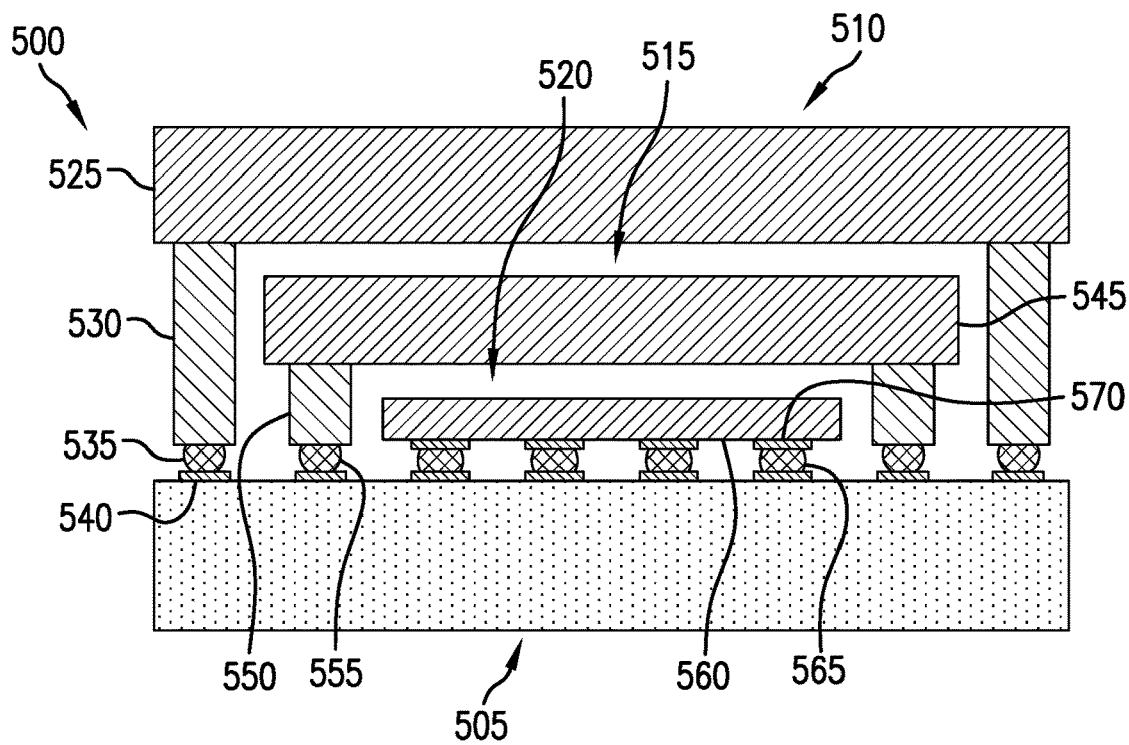
FIG. 5B shows a sectional view of the three FIG. 5A stacked capacitors mounted on the substrate.

FIGS. 5A and 5B shows three stacked capacitors 500 in accordance with a first illustrative embodiment of the invention. FIG. 5A shows a bottom view of the three stacked capacitors 500 configured for mounting to a substrate 505 of an IC module, while FIG. 5B shows a sectional view of the same three stacked capacitors 500 actually mounted on the substrate 505 along the cleave plane indicated in FIG. 5A. In the present non-limiting embodiment, the three stacked capacitors 500 include: an upper Si DT capacitor 510, a middle Si DT capacitor 515, and a lower Si DT capacitor 520.

Each of the three stacked capacitors 500 is mounted via solder bumps to bonding pads defined by the substrate 505. The three stacked capacitors are thereby mounted in a manner consistent with a flip chip mounting technology. However, in order to facilitate the stacking, columnar pillars are implemented in the upper and middle Si DT capacitors 510, 515. More particularly, the upper Si DT capacitor 510 comprises an upper body 525 from which extends a plurality of upper pillars 530. The upper pillars 530 extend from the upper body 525 towards the substrate 505. Each of the upper pillars 530, in turn, is mounted on the substrate 505 via a respective upper solder bump 535 and a corresponding bonding pad 540. Likewise, the middle Si DT capacitor 515 comprises a middle body 545 from which extend a plurality of middle pillars 550. Each of the middle pillars 550 is mounted on a respective bonding pad 540 of the substrate 505 via a respective middle solder bump 555. Finally, the lower Si DT capacitor 520 comprises a lower body 560 and is mounted directly to the substrate 505 without the use of pillars. Rather, the lower Si DT capacitor 520 is mounted via lower solder bumps 565 disposed between lower chip pads 570 and bonding pads 540.

In the illustrative embodiment shown in FIGS. 5A and 5B, the three stacked capacitors 500 become increasingly larger in the width (i.e., x-direction) and height (i.e., z-direction) as one moves away from the substrate. This allows the respective capacitance of each of the three stacked capacitors 500 to become progressively greater as the three stacked capacitors 500 are stacked one above the other.

In accordance with aspects of the invention, the pillars 530, 550 of the upper and middle Si DT capacitors 510, 515 pass lateral to at least a portion of the lower Si DT capacitor 520. In one or more embodiments, the pillars 530, 550 may comprise a conductive metal such as copper, and may be formed using a standard C4 bumping technology. Once the various solder bumps 535, 555, 565 are placed on the corresponding bonding pads 540 of the substrate 505, a furnace or another means of applying heat may be utilized to melt the solder bumps 535, 555, 565 and have them adhere permanently to the substrate 505. The solder bumps 535, 555, 565 may comprise any suitable solder material, such as one comprising, as just one example, lead and tin, although other compositions are contemplated and would also come within the scope of the invention.

Figure 6:
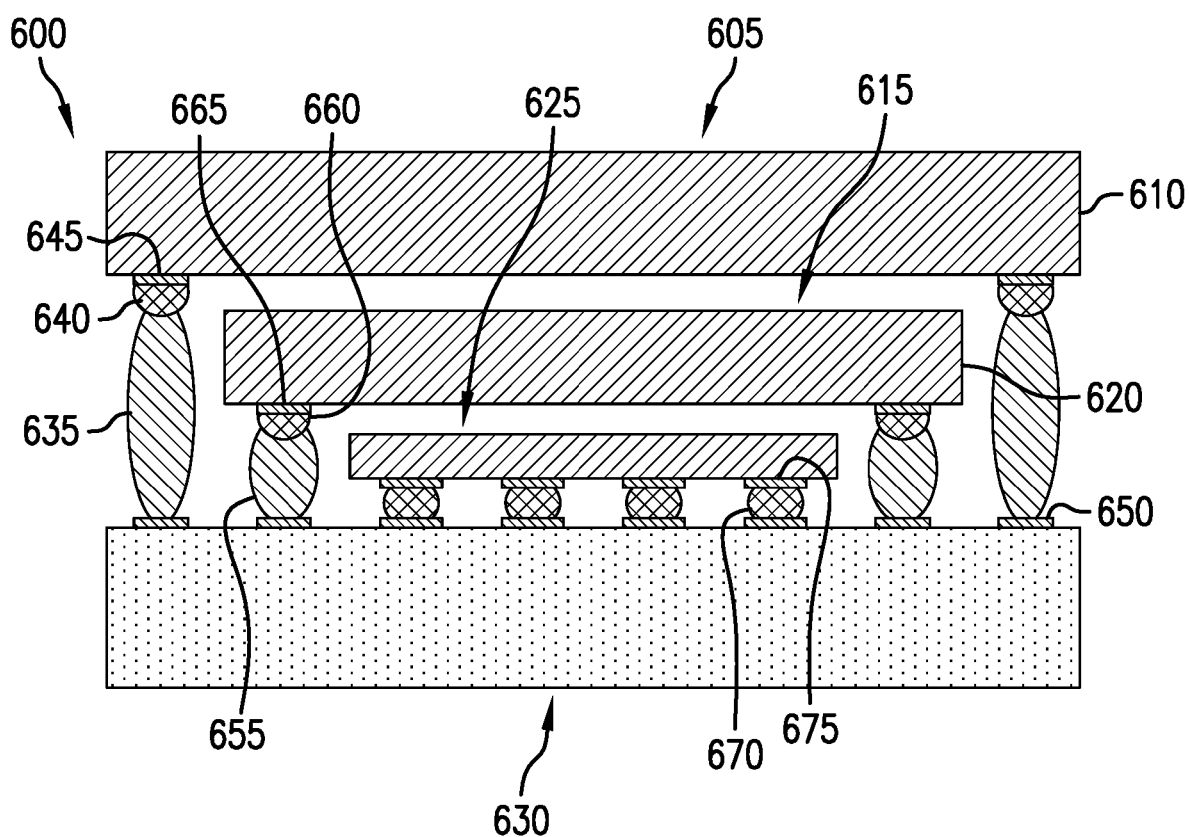
FIG. 6 shows a sectional view of three stacked capacitors mounted on a substrate, in accordance with a second embodiment of the invention.

FIG. 6 shows a sectional view of a variation on the embodiment shown in FIGS. 5A and 5B, in accordance with a second illustrative embodiment of the invention. In a manner similar to the previous embodiment, three stacked capacitors 600 in FIG. 6 include: an upper Si DT capacitor 605 with an upper body 610, a middle Si DT capacitor 615 with a middle body 620, and a lower Si DT capacitor 625, with each of the capacitors 605, 615, 625 mounted on a substrate 630. However, instead of utilizing columnar pillars like those shown in FIGS. 5A and 5B, an alternative form of pillars is utilized to mount the upper and middle Si DT capacitors 605, 615 in FIG. 6. More specifically, the upper Si DT capacitor 605 comprises a plurality of upper ovoid pillars 635. The upper end of each upper ovoid pillar 635 is attached to the upper body 610 via a respective upper solder bump 640 and a respective upper chip pad 645, and the lower end of each upper ovoid pillar 635 is attached to a respective bonding pad 650 on the substrate 630. Similarly, the middle Si DT capacitor 615 comprises middle ovoid pillars 655, which are attached to the middle body 620 via middle solder bumps 660 and middle chip pads 665. The lower Si DT capacitor 625 is mounted on the substrate 630 via lower solder bumps 670 disposed between lower chip pads 675 and bonding pads 650.

The upper and middle ovoid pillars 635, 655 may again comprise a conductive metal such as copper. They may be formed by utilizing ball drop technology and either added to the substrate 630 before assembly or during the bond and assembly process prior to capacitor attachment.

Figure 7:
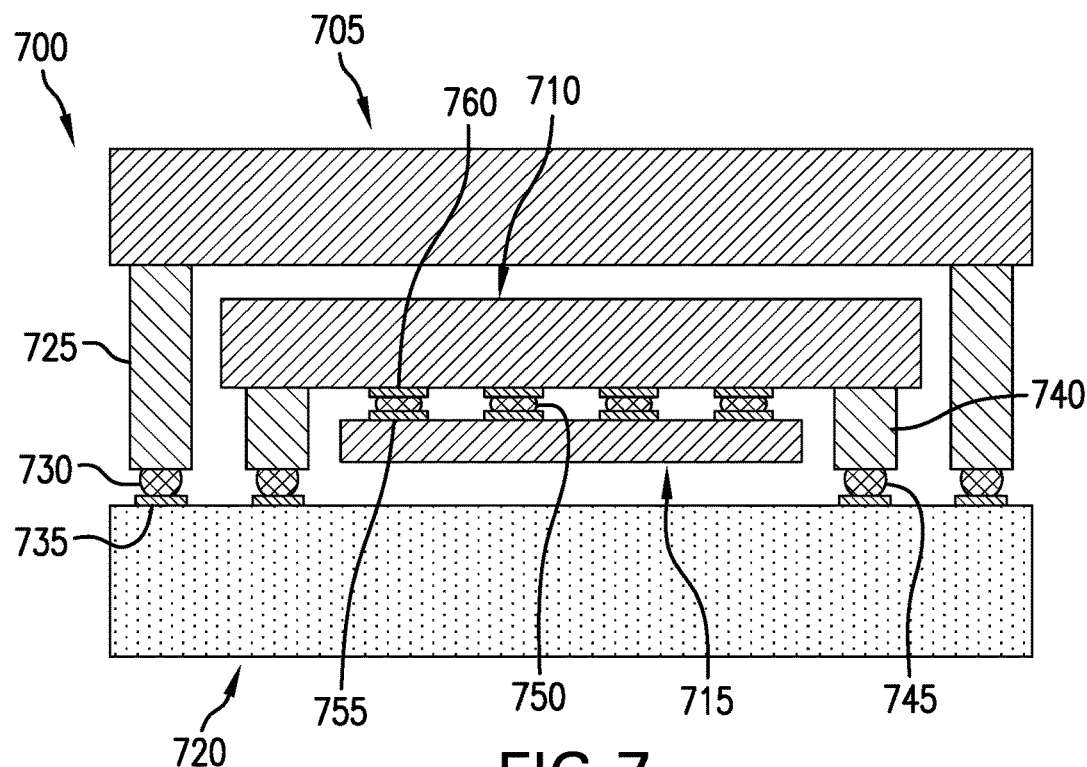
FIG. 7 shows a sectional view of three stacked capacitors mounted on a substrate, in accordance with a third embodiment of the invention.
Figure 8:
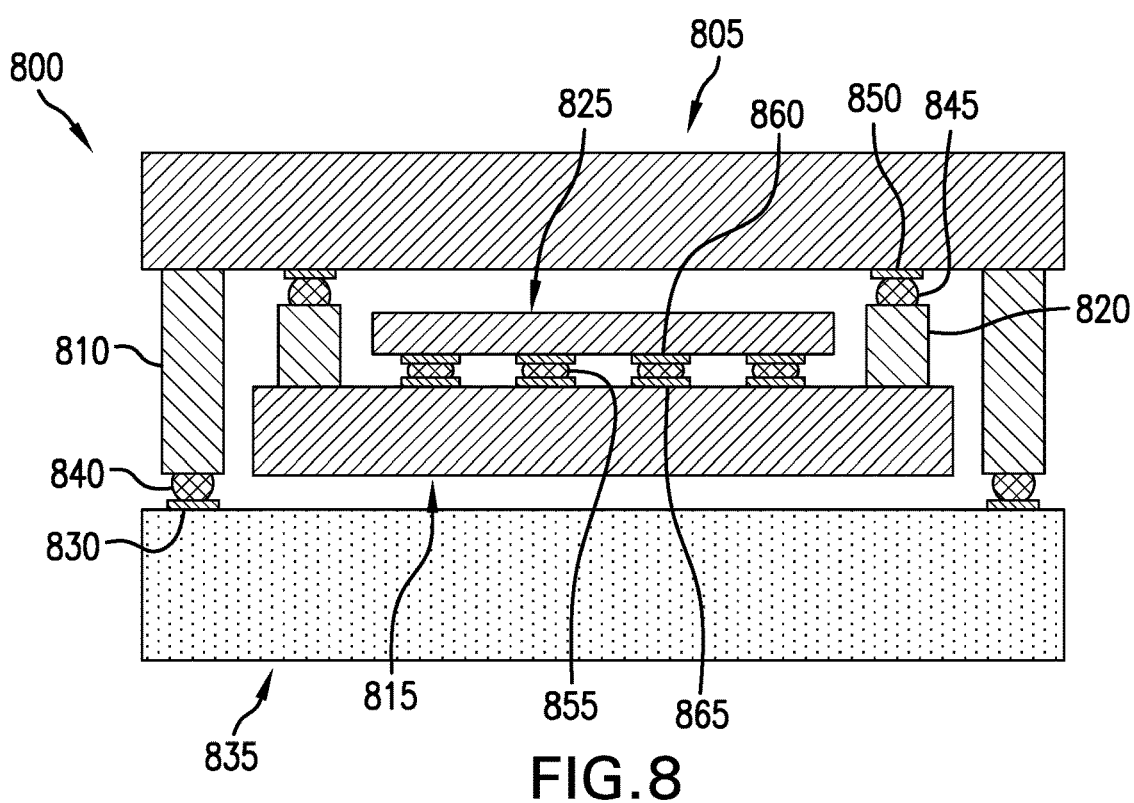
FIG. 8 shows a sectional view of three stacked capacitors mounted on a substrate, in accordance with a fourth illustrative embodiment of the invention.

FIGS. 7 and 8 show respective sectional views of stacked capacitors in accordance with third and fourth additional illustrative embodiments of the invention, respectively. In the embodiment shown in FIG. 7, three stacked capacitors 700 include an upper Si DT capacitor 705, a middle Si DT capacitor 710, and a lower Si DT capacitor 715 in combination with a substrate 720. The upper Si DT capacitor utilizes upper pillars 725, upper solder bumps 730, and bonding pads 735 to mount to the substrate, and the middle Si DT capacitor utilizes middle pillars 740, middle solder bumps 745, and bonding pads 735 to mount to the substrate 720 in a manner similar to that described above for the three stacked capacitors 500 in FIGS. 5A and 5B. In the three stacked capacitors 700 in FIG. 7, however, the lower Si DT capacitor 715 is directly bonded to an underside of the middle Si DT capacitor 710 via lower solder bumps 750, lower chip pads 755, and middle chip pads 760. In FIG. 8, three stacked capacitors 800 include an upper Si DT capacitor 805 with upper pillars 810, a middle Si DT capacitor 815 with middle pillars 820, and a lower Si DT capacitor 825. The upper pillars 810 mount to bonding pads 830 on a substrate 835 via upper solder bumps 840. In the present embodiment, however, the middle Si DT capacitor is mounted on an underside of the upper Si DT capacitor 805 via the middle pillars 820, middle solder bumps 845, and upper chip pads 850, and, in the space made thereby, the lower Si DT capacitor 825 is mounted on top of the middle Si DT capacitor 815 via lower solder bumps 855, lower chip pads 860, and middle chip pads 865.

Figure 9A:
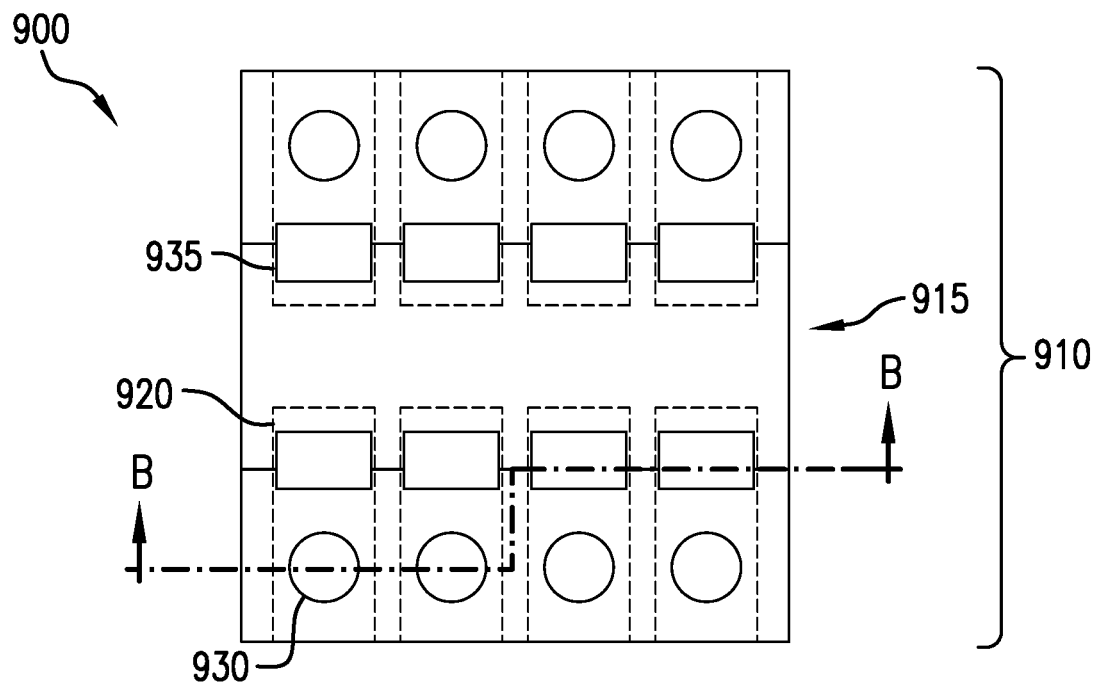
FIG. 9A shows a bottom view of two stacked capacitors configured for mounting to a substrate of a module, in accordance with a fifth illustrative embodiment of the invention.
Figure 9B:
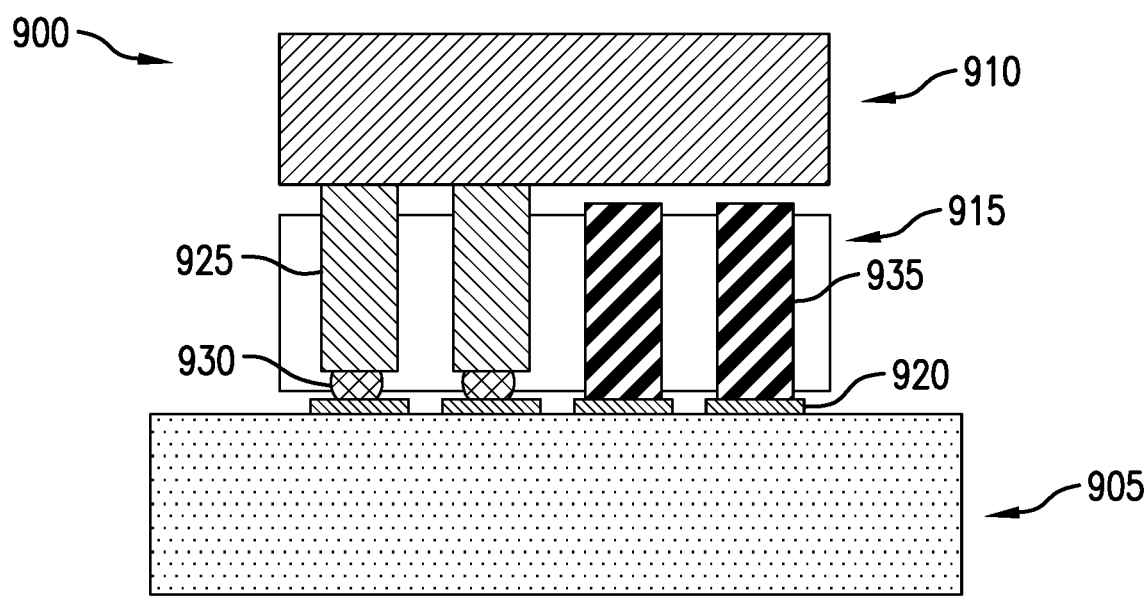
FIG. 9B shows an offset sectional view of the two FIG. 9A stacked capacitors mounted on the substrate.

While the stacked capacitors 500, 600, 700, 800 set forth above utilize combinations of only Si DT capacitors, additional illustrative embodiments falling within the scope of the invention may utilize a combination of Si DT capacitors and ceramic capacitor arrays, or solely ceramic capacitor arrays. FIG. 9A shows a bottom view of two stacked capacitors 900 configured for mounting to a substrate 905 of an IC module, in accordance with a fifth illustrative embodiment of the invention, while FIG. 9B shows an offset sectional view of the two stacked capacitors 900 mounted on the substrate 905 along the nonlinear cleave plane indicated in FIG. 9A. The two stacked capacitors 900 comprise a Si DT capacitor 910 in the upper position and a ceramic capacitor array 915 in the lower position.

Figure 1:
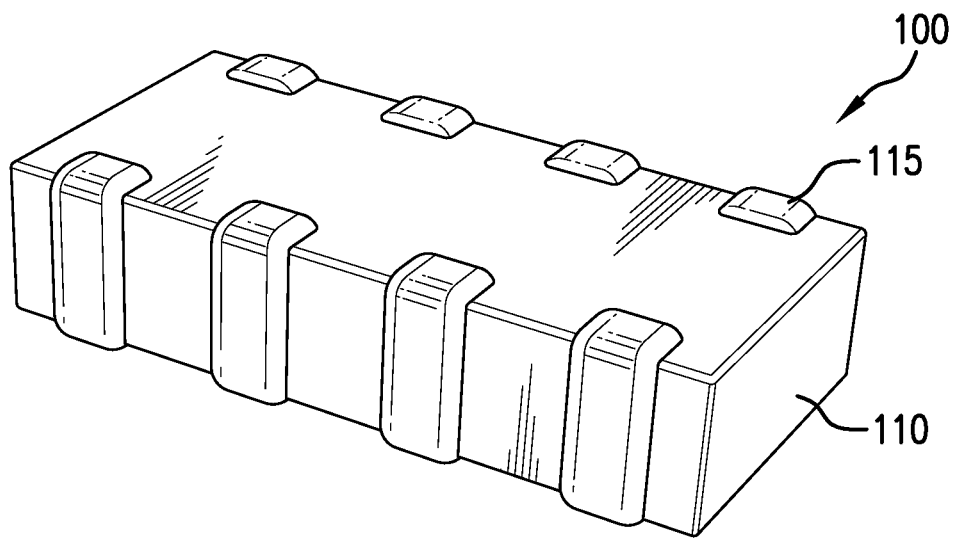
FIG. 1 shows a perspective view of a conventional ceramic capacitor array.
Figure 2:
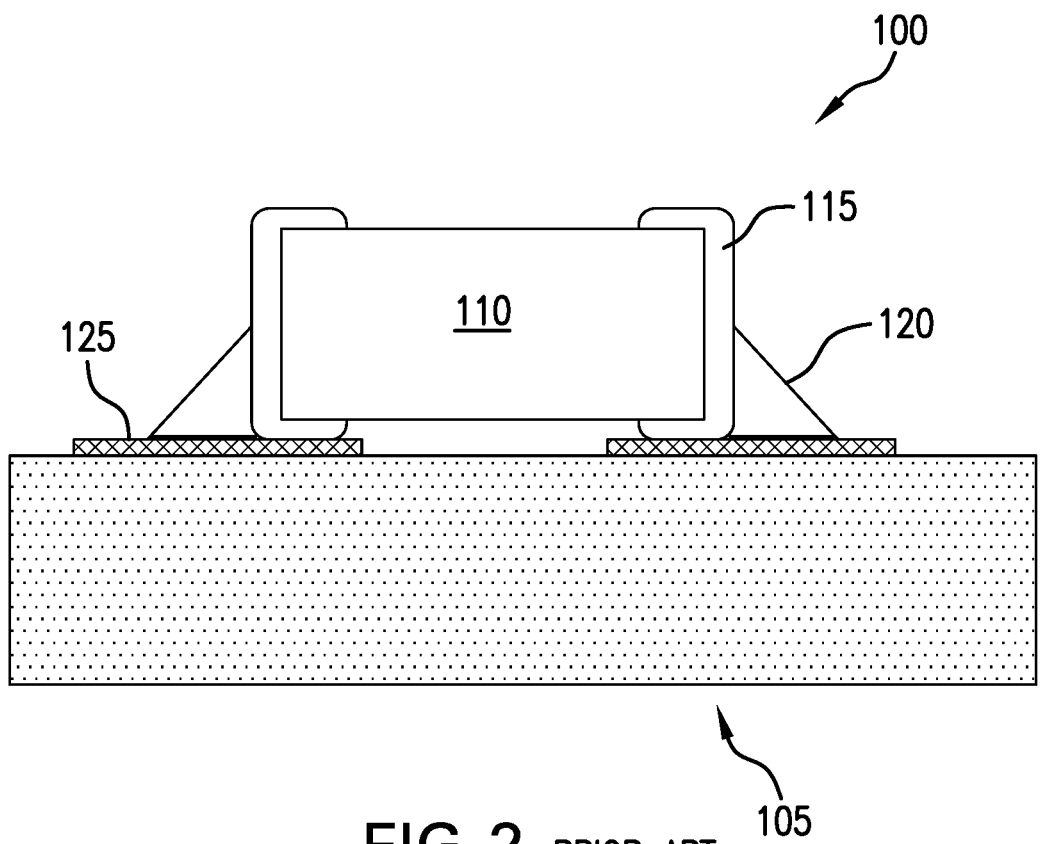
FIG. 2 shows a side view of the FIG. 1 ceramic capacitor array attached to a substrate.
Figure 3:
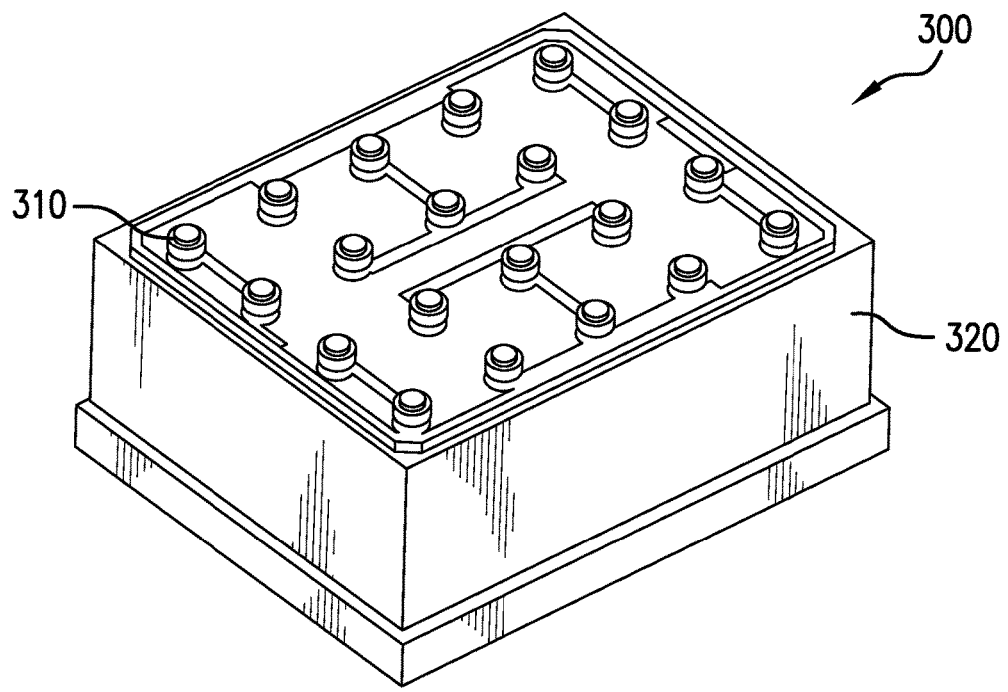
FIG. 3 shows a bottom perspective view of a conventional Si DT capacitor.
Figure 4:
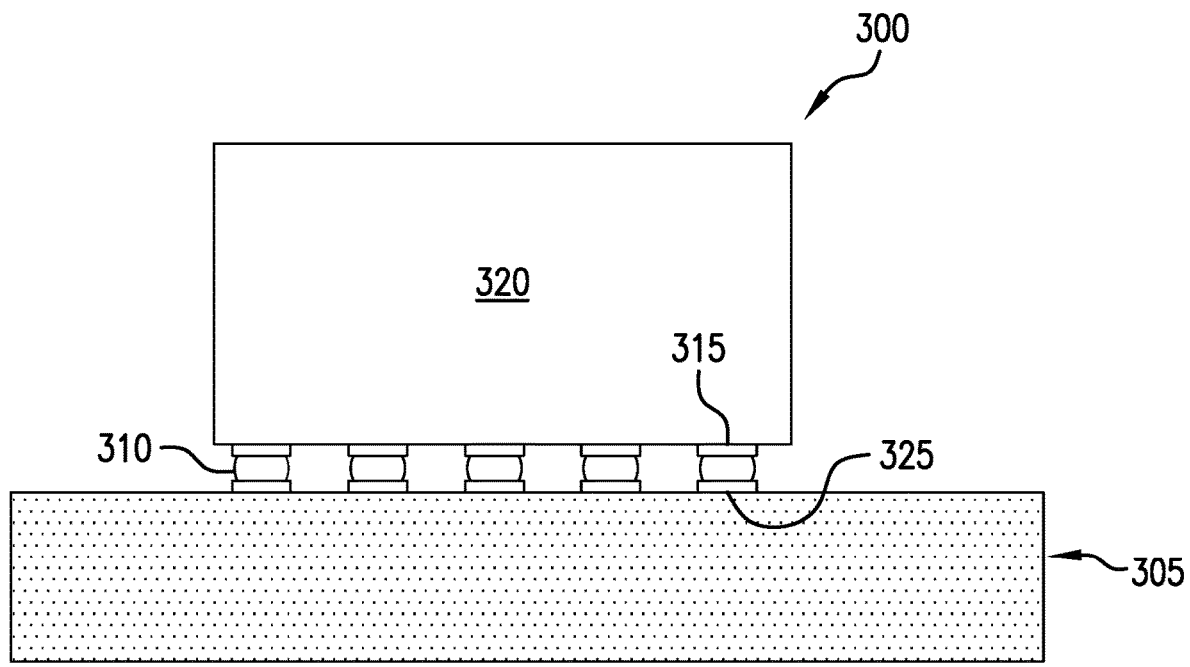
FIG. 4 shows a side view of the FIG. 3 Si DT capacitor attached to a substrate.

Notably, the arrangement of the Si DT capacitor 910 over the ceramic capacitor array 915 allows bonding pads 920 to be placed so that the two stacked capacitors 900 can share common bonding pads 920 when being mounted on the substrate 905. Dotted lines in FIG. 9B represent where bonding pads 920 of the substrate 905 lie relative to the two stacked capacitors 900. The Si DT capacitor utilizes pillars 925 to mount it to the substrate 905 so that the Si DT capacitor is elevated above the ceramic capacitor array 915. These pillars 925 attach to the bonding pads 920 via solder bumps 930, and pass lateral to the ceramic capacitor array 915. The ceramic capacitor array 915, in contrast, utilizes solder joints for interconnection of its terminals 935 with the bonding pads 920 of the substrate, like the solder joints 120 shown in FIG. 2. As is evident with reference to FIG. 9A, neighboring solder bumps 930 from the Si DT capacitor 910 and solder joints from the ceramic capacitor array 915 fall on common bonding pads 920.

Figure 10:
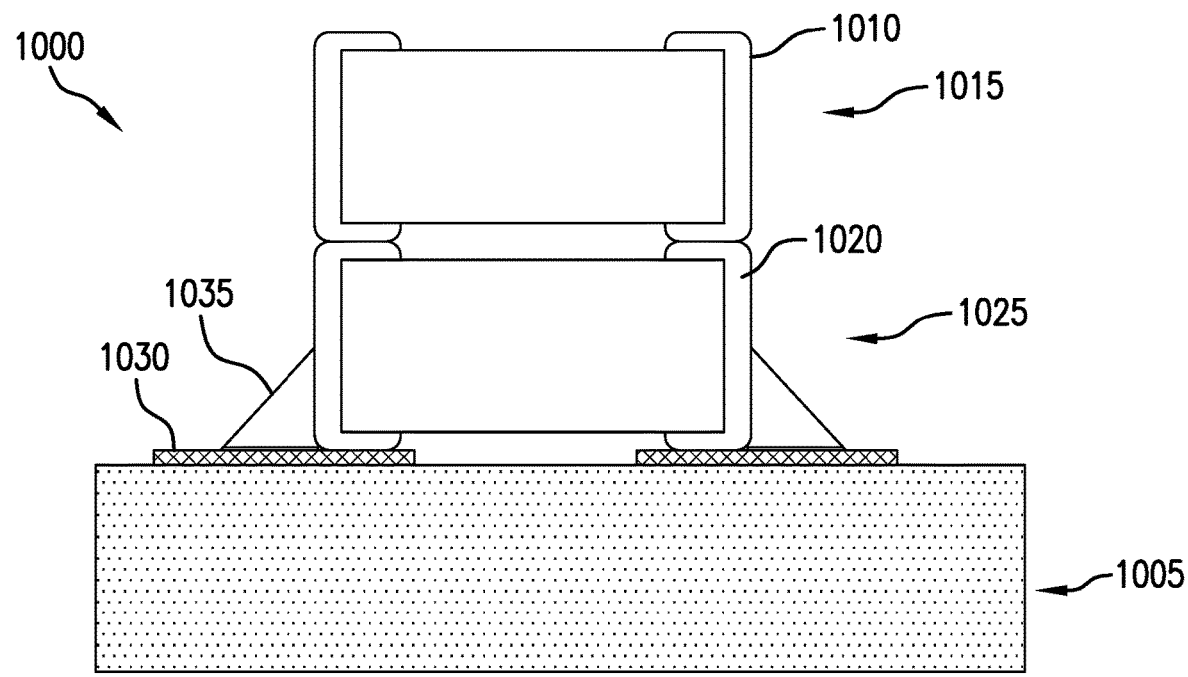
FIG. 10 shows a side view of two stacked capacitors mounted on a substrate, in accordance with a sixth illustrative embodiment of the invention.
Figure 11:
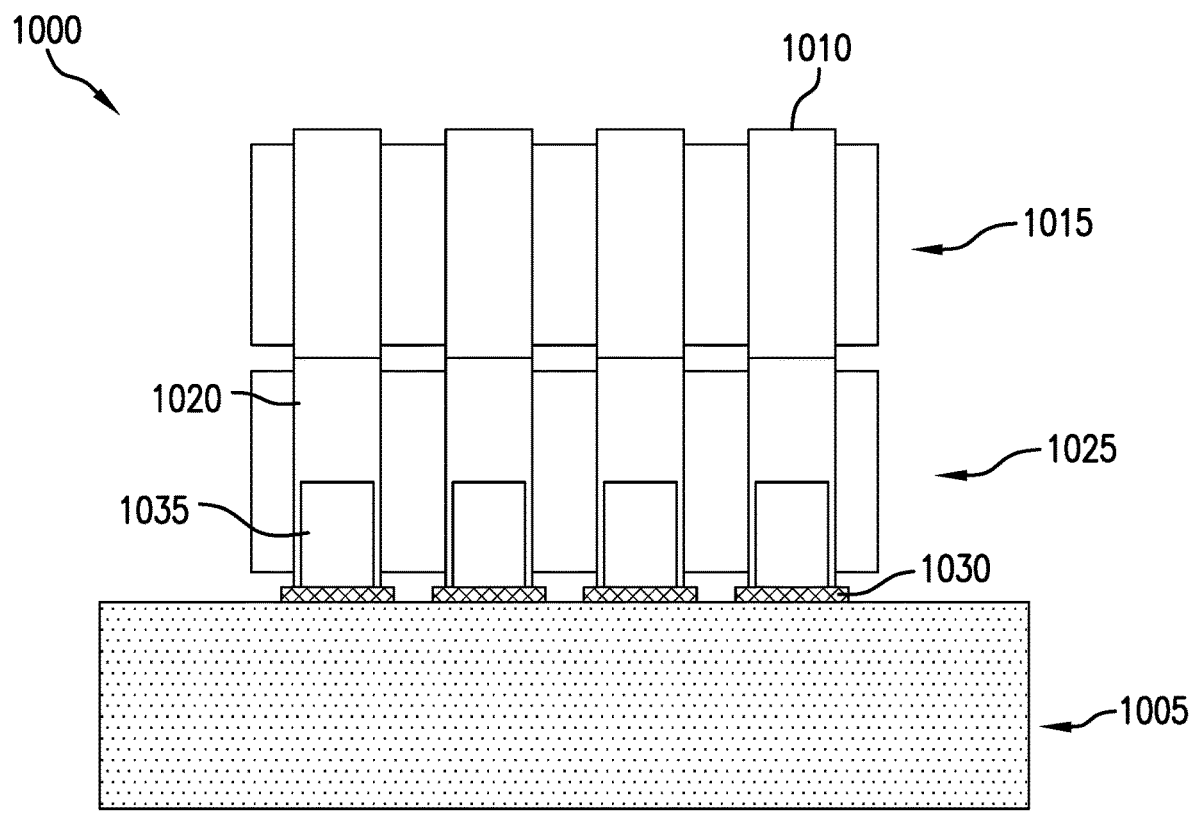
FIG. 11 shows a front view of the two FIG. 10 stacked capacitors mounted on the substrate.

Lastly, FIGS. 10 and 11 show a sixth illustrative embodiment of the invention wherein two ceramic capacitor arrays 1000 are provided in a stacked configuration on a substrate 1005. FIG. 10A shows a front view of the two ceramic capacitor arrays 1000, while FIG. 10B shows a side view of the same capacitors 1000. In the figures, upper terminals 1010 of an upper ceramic capacitor array 1015 are mounted on lower terminals 1020 of a lower ceramic capacitor array 1025. At the same time, the lower terminals 1020 of the lower ceramic capacitor array 1025 are mounted on bonding pads 1030 of the substrate 1005 via solder joints 1035. This may be done by utilizing a standard pick and place tool that places the lower ceramic capacitor array 1025 onto the pre-fluxed substrate 1005, followed by placing the upper ceramic capacitor array 1015 onto the lower ceramic capacitor array 1025, which has been dipped in flux prior to being placed. Here again, an increased number of capacitors for a given substrate area is achieved by stacking capacitors one over the other.

In addition to the increased numbers of capacitors per given area made available by using stacked capacitors like those described above, and, more generally, by configuring capacitors in accordance with aspects of the invention, use of stacked capacitors in the manner taught herein also allows one to place capacitors in close proximity to microprocessor cores and other sensitive circuitry in IC modules. With proper sizing and spacing, for example, wiring escapes from a processor core may be made to pass between capacitor pillars like those set forth above without causing parasitic concerns.

Thus, as indicated above, aspects of the invention can be incorporated into a wide variety of embodiments. In one or more illustrative embodiments (FIGS. 5A-9B), for example, an apparatus comprises a substrate (e.g., substrate 505), an upper capacitor (e.g., upper Si DT capacitor 510), and a lower capacitor (e.g., lower Si DT capacitor 520). The upper capacitor is mounted on the substrate and comprises an upper body (e.g., upper body 525) and a pillar (e.g., upper pillar 530) that extends from the upper body towards the substrate. The lower capacitor comprises a lower body (e.g., lower body 560) that is disposed both lateral to the pillar and at least in part between the upper body and the substrate. Each of the upper capacitor and the lower capacitor is a respective discrete circuit component.

The substrate may form part of an integrated circuit module, which may comprise an integrated circuit mounted to the substrate. In addition, the substrate may define a bonding pad (e.g., bonding pad 540), and the upper capacitor may be mounted on the bonding pad. The upper capacitor may comprise a silicon DT capacitor (FIGS. 5A-9B), and the lower capacitor may comprise a silicon DT capacitor (FIGS. 5A-8). Alternatively, the lower capacitor may comprise a ceramic capacitor array (e.g., ceramic capacitor array 915) (FIGS. 9A and 9B). In some embodiments, the upper capacitor may comprise a first silicon DT capacitor, and the lower capacitor may comprise a second DT capacitor (FIGS. 5A-8). In other embodiments, the upper capacitor may comprise a silicon DT capacitor, and the lower capacitor may comprise a ceramic capacitor array (FIGS. 9A and 9B).

The upper capacitor may be mounted to the substrate at least in part via one or more upper solder bumps (e.g., upper solder bump 535) (FIGS. 5A-9B), and the lower capacitor may be mounted to the substrate at least in part via one or more lower solder bumps (e.g., lower solder bump 565) (FIGS. 5A-6). Alternatively, the upper capacitor may be mounted on the substrate at least in part via one or more solder bumps (e.g., upper solder bump 535) (FIGS. 5A-9B), and the lower capacitor may be mounted on the substrate at least in part via one or more solder joints (e.g., like solder joint 120) (FIGS. 9A and 9B).

In some embodiments, the pillar is columnar (FIGS. 5A, 5B, 7-9B). In other embodiments the pillar is ovoid (FIG. 6). The pillar may comprise copper. In some embodiments, the pillar is attached to the upper body via solder bumps (e.g., upper solder bump 640) (FIG. 6).

In other illustrative embodiments of the invention (FIGS. 5A-8), an apparatus comprises a substrate (e.g., substrate 505), an upper capacitor (e.g., upper Si DT capacitor 510), a lower capacitor (e.g., lower Si DT capacitor 520), and a middle capacitor (e.g., middle Si DT capacitor 515). The upper capacitor is mounted on the substrate and comprises an upper body (e.g., upper body 525) and a pillar (e.g., upper pillar 530) that extends from the upper body towards the substrate. The lower capacitor comprises a lower body (e.g., lower body 560) that is disposed both lateral to the pillar and at least in part between the upper body and the substrate. The middle capacitor comprises a middle body (e.g., middle body 545) that is disposed both lateral to the pillar and at least in part between the upper body and the lower body. Each of the upper capacitor, the lower capacitor, and the middle capacitor is a respective discrete circuit component. The middle capacitor may define a middle pillar (e.g., middle pillar 550) that extends from the middle body.

Even other illustrative embodiments comprise a method (FIGS. 5A-9B). A substrate (e.g., substrate 505) is received. An upper capacitor (e.g., upper Si DT capacitor 510) is mounted on the substrate, the upper capacitor comprising an upper body (e.g., upper body 525) and a pillar (e.g., upper pillar 530) that extends from the upper body towards the substrate. A lower capacitor (e.g., lower Si DT capacitor 520) comprising a lower body (e.g., lower body 560) is placed such that the lower body is disposed both lateral to the pillar and at least in part between the upper body and the substrate. Each of the upper capacitor and the lower capacitor is a respective discrete circuit component. The upper capacitor may comprise a silicon DT capacitor (FIGS. 5A-9B), and the lower capacitor may comprise a silicon DT capacitor (FIGS. 5A-8). Alternatively, the lower capacitor may comprise a ceramic capacitor array (FIGS. 9A and 9B).

Even other illustrative embodiments of the invention (FIGS. 10A and 10B) include an apparatus comprising a substrate (e.g., substrate 1005), a lower capacitor (e.g., lower ceramic capacitor array 1025), and an upper capacitor (e.g., upper ceramic capacitor array 1015). The lower capacitor is mounted on the substrate. The upper capacitor is mounted on the lower capacitor. Each of the lower capacitor and the upper capacitor is a respective discrete circuit component. The lower capacitor may comprise a ceramic capacitor array, and the upper capacitor may comprise a ceramic capacitor array.

In even other illustrative embodiments of the invention, a method (FIGS. 10 and 11) includes receiving a substrate (e.g., substrate 1005). A lower capacitor (e.g., lower ceramic capacitor array 1025) is mounted on the substrate. An upper capacitor (e.g., upper ceramic capacitor array 1015) is mounted on the lower capacitor. Each of the lower capacitor and the upper capacitor is a respective discrete circuit component.

It should again be emphasized that the above-described embodiments of the invention are intended to be illustrative only. Other embodiments may, for example, utilize different elements and configurations from those expressly set forth above to achieve embodiments falling within the scope of the invention. These numerous alternative embodiments within the scope of the appended claims will be apparent to one skilled in the art.

For example, while the illustrative embodiments set forth above include two or three capacitors in stacked configurations, this number is merely illustrative, and other embodiments falling within the scope of the invention could utilize different numbers of capacitors. An alternative embodiment might, for example, only utilize two capacitors in a given stack. Other alternative embodiments may utilize more than three stacked capacitors (e.g., four, five, six, etc.) in a given stack.

At the same time, while only Si DT capacitors and ceramic capacitor arrays were expressly described above, other types of capacitors may be utilized in stacked form and the results would still come within the scope of the invention. Other suitable types of capacitors include, for example, two-terminal ceramic capacitors and silicon capacitors that rely on metal-insulator-metal technology rather than deep-trench technology.

All the features disclosed herein may be replaced by alternative features serving the same, equivalent, or similar purposes, unless expressly stated otherwise. Thus, unless expressly stated otherwise, each feature disclosed is one example only of a generic series of equivalent or similar features.

Any element in a claim that does not explicitly state "means for" performing a specified function or "step for" performing a specified function is not to be interpreted as a "means for" or "step for" clause as specified in AIA 35 U.S.C. § 112(f). In particular, the use of "steps of" in the claims herein is not intended to invoke the provisions of AIA 35 U.S.C. § 112(f).

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An apparatus comprising:
   a substrate forming a portion of an integrated circuit module;
   an upper capacitive discrete circuit component mounted on the substrate and comprising an upper body and a pillar that extends from the upper body towards the substrate;
   at least one additional circuit component; and
   a lower capacitive discrete circuit component comprising a lower body that is disposed both lateral to the pillar and at least in part between the upper body and the substrate, the lower capacitive discrete circuit component being separated by space from the substrate for accommodating the at least one additional circuit component, the at least one additional circuit component being separated by space from the pillar, the lower capacitive discrete circuit component, and the upper capacitive discrete circuit component;
   wherein each of the upper capacitive discrete circuit component and the lower capacitive discrete circuit component is a respective discrete circuit component having only a capacitive electrical property for the integrated circuit module.

2. The apparatus of claim 1, further comprising an integrated circuit mounted on the substrate.

3. The apparatus of claim 1, wherein:
   the substrate defines a bonding pad; and
   the upper capacitive discrete circuit component is mounted on the bonding pad.

4. The apparatus of claim 1, wherein the upper capacitive discrete circuit component comprises a silicon deep trench capacitor.

5. The apparatus of claim 1, wherein the lower capacitive discrete circuit component comprises a silicon deep trench capacitor.

6. The apparatus of claim 1, wherein the lower capacitive discrete circuit component comprises a ceramic capacitor array.

7. The apparatus of claim 1, wherein:
the upper capacitive discrete circuit component comprises a first silicon deep trench capacitor; and
the lower capacitive discrete circuit component comprises a second silicon deep trench capacitor.

8. The apparatus of claim 1, wherein:
the upper capacitive discrete circuit component comprises a silicon deep trench capacitor; and
the lower capacitive discrete circuit component comprises a ceramic capacitor array.

9. The apparatus of claim 1, wherein:
the upper capacitive discrete circuit component is mounted on the substrate at least in part via one or more upper solder bumps; and
the lower capacitive discrete circuit component is mounted on the substrate at least in part via one or more lower solder bumps.

10. The apparatus of claim 1, wherein:
the upper capacitive discrete circuit component is mounted on the substrate at least in part via one or more solder bumps; and
the lower capacitive discrete circuit component is mounted on the substrate at least in part via one or more solder joints.

11. The apparatus of claim 1, wherein the pillar is columnar.

12. The apparatus of claim 1, wherein the pillar is ovoid.

13. The apparatus of claim 1, wherein the pillar comprises copper.

14. The apparatus of claim 1 wherein the pillar is attached to the upper body via solder.

15. An apparatus comprising:
a substrate forming a portion of an integrated circuit module;
an upper capacitive discrete circuit component mounted on the substrate and comprising an upper body and a pillar that extends from the upper body towards the substrate;
a lower capacitive discrete circuit component comprising a lower body that is disposed both lateral to the pillar and at least in part between the upper body and the substrate, the lower capacitive discrete circuit component being separated by space from the pillar; and
a middle capacitive discrete circuit component comprising a middle body that is disposed both lateral to the pillar and at least in part between the upper body and the lower body;
wherein each of the upper capacitive discrete circuit component, the lower capacitive discrete circuit component, and the middle capacitive discrete circuit component is a respective discrete circuit component having only a capacitive electrical property for the integrated circuit module.

16. The apparatus of claim 15, wherein the middle capacitive discrete circuit component defines a middle pillar that extends from the middle body.

17. A method comprising the steps of:
receiving a substrate forming a portion of an integrated circuit module;
mounting an upper capacitive discrete circuit component on the substrate, the upper capacitive discrete circuit component comprising an upper body and a pillar that extends from the upper body towards the substrate;
placing an additional circuit component on the substrate; and
placing a lower capacitive discrete circuit component comprising a lower body such that the lower body is disposed both lateral to the pillar and at least in part between the upper body and the substrate, the lower capacitive discrete circuit component being separated by space from the substrate for accommodating the at least one additional circuit component, the at least one additional circuit component being separated by space from the pillar, the lower capacitive discrete circuit component, and the upper capacitive discrete circuit component;
wherein each of the upper capacitive discrete circuit component and the lower capacitive discrete circuit component is a respective discrete circuit component having only a capacitive electrical property for the integrated circuit module.

18. The method of claim 17, wherein the upper capacitive discrete circuit component comprises a silicon deep trench capacitor.

19. The method of claim 17, wherein the lower capacitive discrete circuit component comprises a silicon deep trench capacitor.

20. The method of claim 17, wherein the lower capacitive discrete circuit component comprises a ceramic capacitor array.

21. An apparatus comprising:
a substrate forming a portion of an integrated circuit module;
a lower capacitive discrete circuit component mounted on the substrate;
at least one additional circuit component; and
an upper capacitive discrete circuit component mounted on the lower capacitor, the lower capacitive discrete circuit component being separated by space from the substrate for accommodating the at least one additional circuit component, the at least one additional circuit component being separated by space from the lower capacitive discrete circuit component and the upper capacitive discrete circuit component;
wherein each of the lower capacitive discrete circuit component and the upper capacitive discrete circuit component is a respective discrete circuit component having only a capacitive electrical property for the integrated circuit module.

22. The apparatus of claim 21, wherein the lower capacitive discrete circuit component comprises a ceramic capacitor array.

23. The apparatus of claim 21, wherein the upper capacitive discrete circuit component comprises a ceramic capacitor array.

24. A method comprising the steps of:
receiving a substrate forming a portion of an integrated circuit module;
mounting a lower capacitive discrete circuit component on the substrate; and
mounting an upper capacitive discrete circuit component on the lower capacitor, the lower capacitive discrete circuit component being separated by space from the substrate for accommodating at least one additional circuit component, the at least one additional circuit component being separated by space from the lower capacitive discrete circuit component and the upper capacitive discrete circuit component;
wherein each of the lower capacitive discrete circuit component and the upper capacitive discrete circuit component is a respective discrete circuit component having only a capacitive electrical property for the integrated circuit module.

* * * * *